(12) United States Patent
Kobilke

(10) Patent No.: US 8,198,644 B2
(45) Date of Patent: *Jun. 12, 2012

(54) MULTICHIP ON-BOARD LED ILLUMINATION DEVICE

(75) Inventor: Siegmund Kobilke, Ingolstadt (DE)

(73) Assignee: Excelites Technologies Elcos GmbH, Pfaffenhofen (DE)

( * ) Notice: Subject to any disclaimer, the term of this patent is extended or adjusted under 35 U.S.C. 154(b) by 792 days.

This patent is subject to a terminal disclaimer.

(21) Appl. No.: 12/328,876

(22) Filed: Dec. 5, 2008

(65) Prior Publication Data

US 2009/0080184 A1   Mar. 26, 2009

Related U.S. Application Data

(63) Continuation of application No. 11/265,914, filed on Nov. 3, 2005, now Pat. No. 7,479,660.

(60) Provisional application No. 60/728,861, filed on Oct. 21, 2005.

(51) Int. Cl.
*H01L 33/00* (2010.01)
*F21V 33/00* (2006.01)

(52) U.S. Cl. ..... 257/89; 257/99; 257/100; 257/E33.056; 362/231; 362/252

(58) Field of Classification Search .............. 257/98, 257/89, 99, 100, E33.056; 362/231, 252
See application file for complete search history.

(56) References Cited

U.S. PATENT DOCUMENTS

| | | | |
|---|---|---|---|
| 5,808,592 A | 9/1998 | Mizutani et al. | 345/83 |
| 5,998,925 A | 12/1999 | Shimizu et al. | 313/503 |
| 6,033,087 A | 3/2000 | Shozo et al. | 362/244 |
| 6,127,783 A | 10/2000 | Pashley et al. | 315/149 |
| 6,149,283 A | 11/2000 | Conway et al. | 362/236 |
| 6,234,645 B1 | 5/2001 | Börner et al. | 362/231 |
| 6,255,786 B1 | 7/2001 | Yen | 315/291 |
| 6,411,046 B1 | 6/2002 | Muthu | 315/309 |
| 6,489,637 B1 * | 12/2002 | Sakamoto et al. | 257/98 |
| 6,496,162 B2 | 12/2002 | Kawakami et al. | 345/46 |
| 6,513,949 B1 | 2/2003 | Marshall et al. | 362/231 |
| 6,548,832 B1 * | 4/2003 | Sakamoto et al. | 257/88 |
| 6,563,139 B2 | 5/2003 | Hen | 257/89 |
| 6,583,791 B2 * | 6/2003 | Berryman et al. | 345/589 |
| 6,630,801 B2 | 10/2003 | Schuurmans | 315/307 |

(Continued)

FOREIGN PATENT DOCUMENTS

CN   1291282 A   4/2001

(Continued)

OTHER PUBLICATIONS

International Search Report dated Apr. 13, 2007, for PCT Application No. PCT/EP2006/012315 filed Dec. 20, 2006, 3 pages.

(Continued)

*Primary Examiner* — Evan Pert
(74) *Attorney, Agent, or Firm* — Peter A. Nieves; Sheehan Phinney Bass + Green PA

(57) ABSTRACT

An LED-based illumination device can use an array of four LEDs to produce high intensity light over a broad color spectrum and a broad range of color temperature. A high quality white light can be produced by using two green LEDs with a single red and a single blue LED.

22 Claims, 7 Drawing Sheets

U.S. PATENT DOCUMENTS

| | | | |
|---|---|---|---|
| 6,696,784 B2 | 2/2004 | Yoshida et al. | 313/498 |
| 6,697,130 B2 | 2/2004 | Weindorf et al. | |
| 6,812,498 B1 | 11/2004 | Moon | 257/79 |
| 6,817,735 B2 | 11/2004 | Shimizu et al. | 362/231 |
| 6,871,982 B2 * | 3/2005 | Holman et al. | 362/331 |
| 6,982,518 B2 | 1/2006 | Chou et al. | 313/46 |
| 7,015,825 B2 | 3/2006 | Callahan | |
| 7,095,056 B2 | 8/2006 | Vitta et al. | |
| 7,140,751 B2 | 11/2006 | Lin | 362/250 |
| 7,352,006 B2 * | 4/2008 | Beeson et al. | 257/79 |
| 7,479,660 B2 | 1/2009 | Kobilke | |
| 7,494,259 B2 | 2/2009 | Hayashi et al. | |
| 7,564,180 B2 * | 7/2009 | Brandes | 313/501 |
| 7,829,899 B2 | 11/2010 | Hutchins | |
| 7,943,941 B2 | 5/2011 | Shimizu et al. | |
| 7,997,771 B2 * | 8/2011 | Epstein et al. | 362/339 |
| 2002/0047624 A1 | 4/2002 | Stam et al. | 315/291 |
| 2002/0130326 A1 | 9/2002 | Tamura et al. | |
| 2003/0193789 A1 | 10/2003 | Karlicek, Jr. | 361/760 |
| 2004/0027481 A1 | 2/2004 | Asai et al. | 348/372 |
| 2004/0037080 A1 | 2/2004 | Luk et al. | |
| 2004/0070558 A1 | 4/2004 | Cok et al. | |
| 2004/0155225 A1 | 8/2004 | Yamada et al. | |
| 2004/0207341 A1 | 10/2004 | Callahan | 315/291 |
| 2004/0218387 A1 | 11/2004 | Gerlach | 362/231 |
| 2004/0251820 A1 | 12/2004 | Cok et al. | |
| 2005/0052378 A1 | 3/2005 | Hacker | 345/84 |
| 2005/0122065 A1 | 6/2005 | Young | |
| 2005/0127381 A1 | 6/2005 | Vitta et al. | 257/88 |
| 2005/0140270 A1 | 6/2005 | Henson et al. | |
| 2005/0152146 A1 | 7/2005 | Owen et al. | |
| 2005/0276053 A1 * | 12/2005 | Nortrup et al. | 362/294 |
| 2006/0126326 A1 | 6/2006 | Ng et al. | |
| 2006/0139580 A1 * | 6/2006 | Conner | 353/98 |
| 2006/0152140 A1 | 7/2006 | Brandes | |
| 2007/0109779 A1 | 5/2007 | Sekiguchi et al. | |
| 2007/0115662 A1 | 5/2007 | Roberts et al. | |
| 2007/0215888 A1 | 9/2007 | Mitsuhashi | |
| 2007/0273290 A1 | 11/2007 | Ashdown et al. | |
| 2007/0295972 A1 | 12/2007 | Tsai et al. | |
| 2008/0164484 A1 | 7/2008 | Lee | 257/89 |
| 2009/0046453 A1 | 2/2009 | Kramer | |
| 2009/0080184 A1 | 3/2009 | Kobilke | |

FOREIGN PATENT DOCUMENTS

| | | |
|---|---|---|
| CN | 1375653 A | 10/2002 |
| CN | 1614658 A | 5/2005 |
| DE | 10335077 A1 | 3/2005 |
| WO | WO 2004/100265 A2 | 11/2004 |
| WO | WO 2005/108853 A1 | 11/2005 |
| WO | WO-2006/098561 A1 | 9/2006 |

OTHER PUBLICATIONS

OSRAM Press Release, "See the World in a New Light," May 2005, 1 page in length.

OSRAM Press Release, "Light Source Predicted to Revolutionize Projection and Lighting Markets," Oct. 22, 2004, 1 page in length.

OSRAM Press Release, "OSRAM Opto Semiconductors Redefines Lighting at Lightfair International 2005; OSRAM Premiers its OSTAR LED for Emerging Illumination Applications," Apr. 11, 2005, 2 pages in length.

P. Deurenberg et al., "Achieving color point stability in RGB multi-chip LED modules using various color control loops," *Proc. of SPIE—Fifth International Conference on Solid State Lighting*, vol. 5941, Sep. 7, 2005, pp. C-1 through C-12.

C. Hoelen et al., "Multi-chip color variable LED spot modules," *Proc. of SPIE—Fifth International Conference on Solid State Lighting*, vol. 5941, Aug. 2, 2005, pp. A-1 through A-12.

Non Final Office Action for U.S. Appl. No. 12/158,161, mailed on Jan. 3, 2011, 13 pages.

Office Action for Chinese Patent Application No. 200680047527.3, issued on Jul. 4, 2011, 5 pages (3 pages of English Translation and 2 pages of Office Action).

Final Office Action for U.S. Appl. No. 12/158,161, mailed on May 24, 2011, 13 pages.

Non Final Office Action for U.S. Appl. No. 12/158,161, mailed on Sep. 16, 2011, 13 pages.

Non Final Office Action for U.S. Appl. No. 12/158,161, mailed on Nov. 17, 2011, 13 pages.

* cited by examiner

MULTICHIP ON-BOARD LED ILLUMINATION DEVICE

PRIORITY CLAIM PROVISIONAL

This application is a continuation of U.S. application Ser. No. 11/265,914, filed Nov. 3, 2005, now U.S. Pat. No. 7,479,660 which in turn claims the benefit of U.S. Provisional Application No. 60/728,861, filed Oct. 21, 2005, both of which applications are incorporated herein by reference.

TECHNICAL FIELD OF THE INVENTION

The present invention relates to illumination systems and devices capable of emitting light at a high power over a large region of the visible spectrum.

BACKGROUND

An increasing number of applications require illumination systems that are small in size but high in intensity. Light sources such as LEDs typically have been used as indicator lights, but have not been used for projection or illumination systems because LEDs typically lack the required intensity. LEDs are desirable sources for many applications, however, due to their small size, low cost, and ease of use. Another problem with LEDs is that they typically are not able to produce a high quality color spectrum. Some existing systems utilize a single blue LED with a phosphorus conversion layer to produce white light. However, the output spectrum of this device is fixed and cannot be varied during use.

DETAILED DESCRIPTION

Systems and methods in accordance with embodiments of the present invention can overcome various deficiencies in existing LED and illumination systems. A device in accordance with one embodiment is a multi-use, compact LED device operable for use in applications such as specialty lighting applications, vision systems, general illumination, architectural lighting, transportation lighting, mood lighting, medical lighting, backlighting, and display/signage applications. Such a device can be a high-power light source, such as may run at up to 4.5 W in one embodiment, utilizing multi chip-on-board (COB) technology. A device in accordance with one embodiment utilizes four LEDs, one red LED, one blue LED, and two green LEDs, in order to produce a high quality white light. Such a device also can operate over a high and wide color temperature range, and can generate a high intensity light with excellent and varied color composition. Such a device also can be highly efficient.

Figure 1:
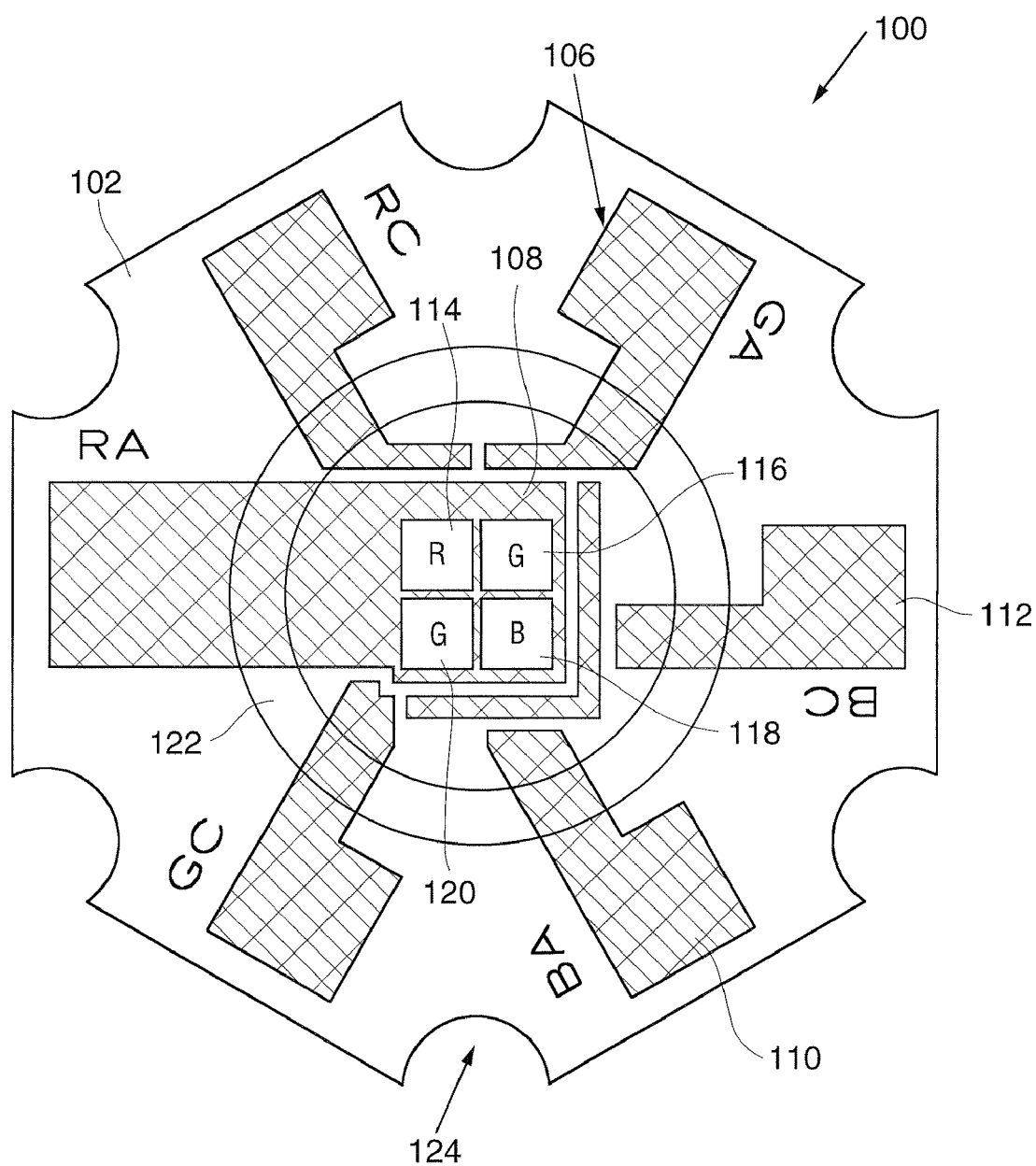
FIG. 1 is a diagram of an illumination device in accordance with one embodiment of the present invention.
Figure 2A:
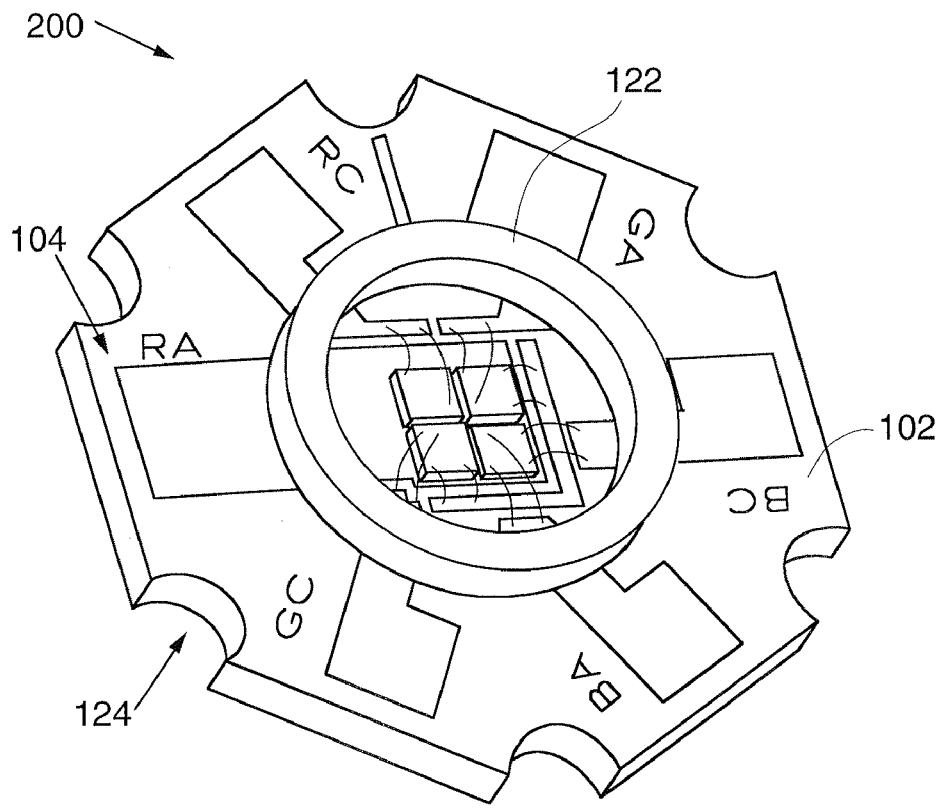
FIG. 2(a) is a perspective view and FIG. 2(b) is an exploded perspective view of the device of FIG. 1.
Figure 2B:
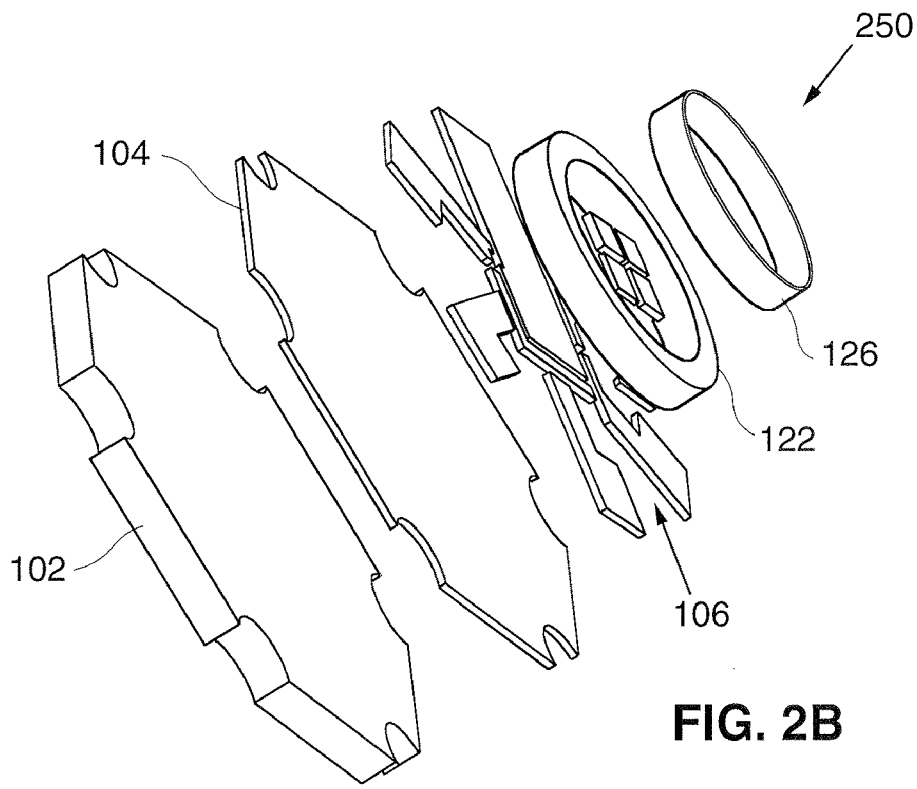
Figure 3A:
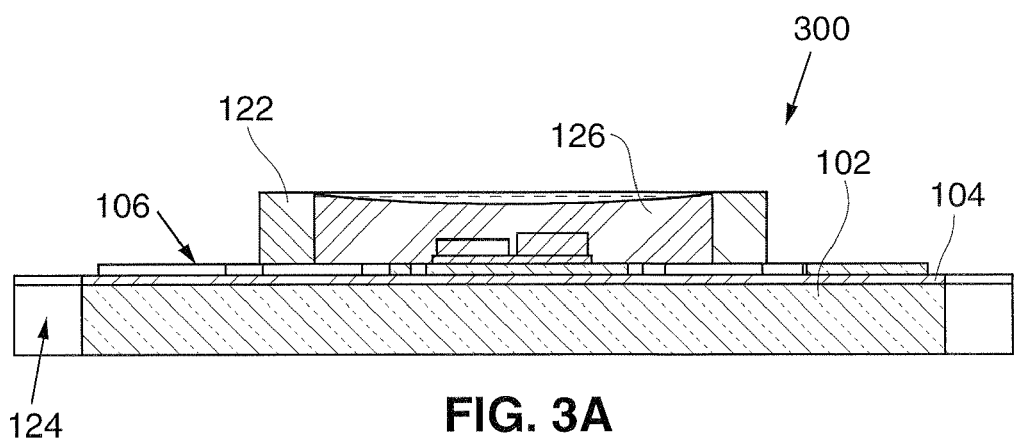
FIG. 3(a) is a side view corresponding to the cross-section in the top view of FIG. 3(b)
Figure 3B:
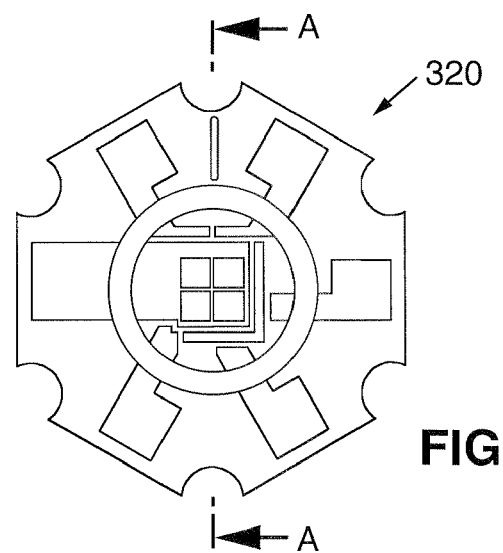
FIG. 3(c) is a side perspective view of the device of FIG. 1.
Figure 3C:
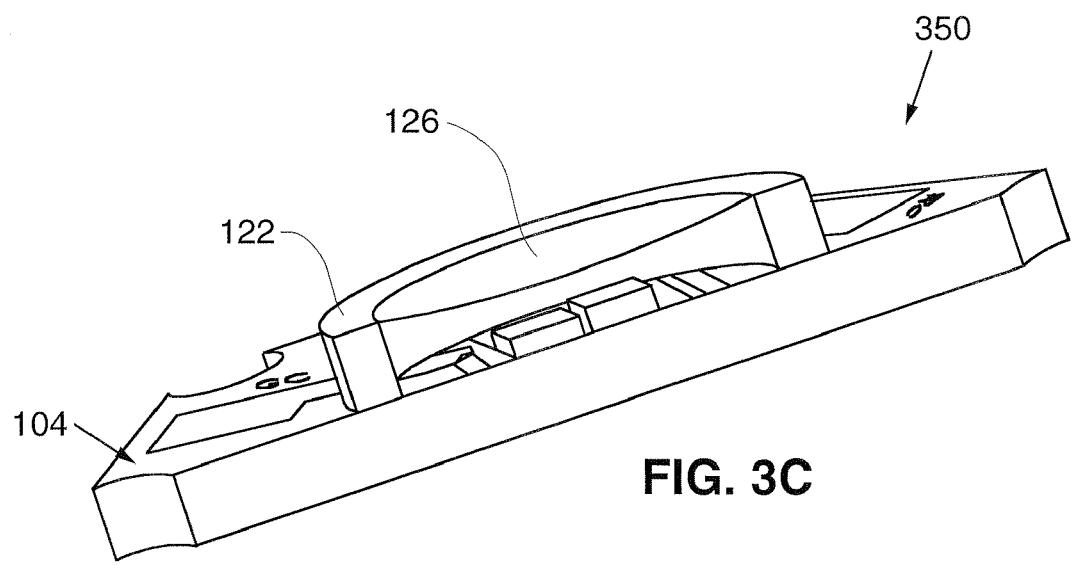

An illumination device in accordance with one embodiment is shown in the top view 100, 320, perspective view 200, 250, and side view 300, 350 diagrams of FIGS. 1-3, respectively. Numbers will be carried over between figures where appropriate for simplicity. The illumination device consists of a substrate 102 formed of an appropriate material, such as a copper PCB having a standard PCB thickness. In one embodiment, the copper is about 1 mm thick. A substrate such as copper can guarantee good thermal conditions for such a device. The substrate can have an isolation layer 104 deposited or otherwise formed thereon. The isolation layer can be made of any appropriate thermally conductive material, such as a layer of epoxy material mixed with ceramic powder for electrical isolation. The isolation layer can be thin, such as on the order of about 60-70 μm thick.

Upon the isolation layer 104 can be placed a circuit layout 106, such as may be formed from a material such as copper. The circuit layout can have any appropriate thickness, such as a thickness of about 35 μm, and can have a thin layer of gold thereon, such as a layer of about 0.4-0.6 μm thick. The layout can have a central pad region 108, as well as an anode pad 110 and a cathode pad 112 for each color LED (identified here for blue) to be used in the device. Upon the circuit layout can be placed appropriate wire bonding material (not shown), such as nickel/gold wire bonding as known in the art. A solder mask or color print (not shown) also can be placed on top of the copper circuit as desired.

A square array of four LED chips 114, 116, 118, 120 is placed on the central pad region 108 in this embodiment, although other arrangements and combinations are possible to obtain a desired intensity and/or color combination. The LEDs can be attached to the pad through any appropriate mechanism, such as silver epoxy glue of about 10 μm in thickness. The LEDs can be any appropriate high intensity LEDs, such as LEDs having a thickness of about 120 μm and an active area of less than 1 mm² that operate at currents up to about 500 mA per die. The design for heat dissipation allows the LEDs to be packed tightly together in order to improve color mixing. The die can be mounted on a very small area of the circuit board, such as an area of less than 9 mm² (having dimensions of 2.1 mm×2.1 mm, for example), while the underlying layers substantially dissipate heat generated by the LEDs without damaging the device. Since the majority of the heat is dissipated, the wavelength shift of the LEDs due to temperature effects can be reduced. This helps to control the color output of the device over time.

One of the LEDs, in this embodiment the red LED 114, can have an electrical connection between the back side of the LED and the central pad region of the circuit layout. The other LED chips, here the blue and two green LEDs, can be isolated from the circuit layout so that only the back side of the red LED is in contact with the pad. The red LED 114 then can have a single wire bond on the front surface, while the blue 118 and green 116, 120 LEDs each have two wire bonds on the front surface. Each wire bond can go to the anode or cathode for the respective LED in order to allow for activation and control of the LEDs through connection with the anodes and cathodes as known in the art. The bonds can use any appropriate material to connect to the appropriate anode/cathode, such as 25 µm diameter gold wire. Allowing only one of the LEDs to be in electrical contact with the central pad region 108 of the circuit layout 106 allows all four chips to be glued to the same pad, simplifying the design and manufacture of the device and allowing the LED chips to be placed in sufficient proximity to one another to obtain good color blending. In this embodiment, the LED chips are placed only 0.1 mm apart in order to minimize the footprint of the LEDS and maximize color blending. Bonding the backs of all the LEDs to individual bond pads can limit design options and flexibility.

After the wire bonds are formed to electrically connect the LED chips to the appropriate anode and cathode pads, a retaining ring 122 can be placed around the LED array. The retaining ring can be attached to the isolation layer and circuit layout using any appropriate mechanism, such as epoxy glue. Once in place, an encapsulant material 126 such as silicon can be poured, flowed, or otherwise placed into the retaining ring 122 in order to cover the LED chips and wire bonds. As known in the art, a silicon encapsulant can protect the device electronics, while serving to out couple the light from the LEDs. The retaining ring can be shaped to provide sufficient area and strength for the encapsulant to completely cover the LEDs and bonds in a relatively attractive manner. The structure for retaining the encapsulant also can have other shapes, such as square, octagonal, or any other appropriate shape.

The PCB substrate 102 in this embodiment is shown to have a generally hexagonal structure, but any appropriate polygonal or circular shape can be used as may be required by the end application. Using a hexagonal shape allows the devices to be packed in the tightest possible configuration for three devices, for example. Other shapes could work better for different numbers of devices. The substrate 102 also is seen in this embodiment to include circular recesses 124. These recesses can be used to pass cables and wiring through the device array when the devices are packed, as well as allowing access for screws or other mounting devices. As can be seen for this embodiment, packing three devices together can create a full circular opening therebetween for passing wiring, etc.

Figure 4:
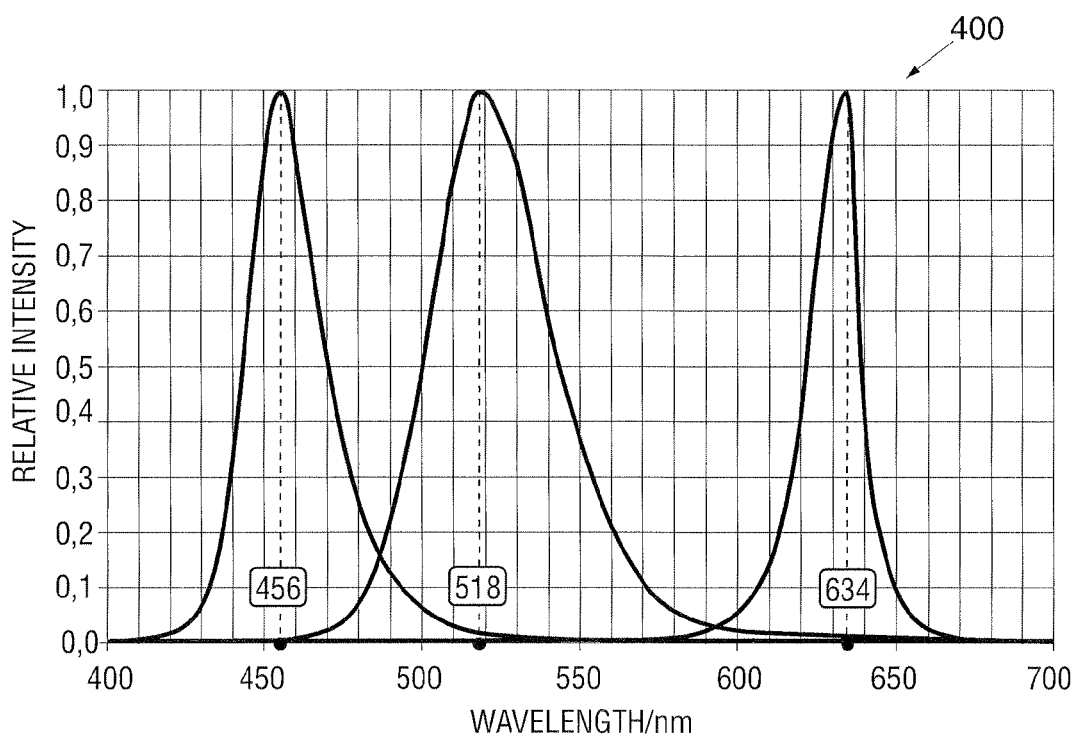
FIG. 4 is a plot of typical spectral distributions that can be obtained with the device of FIG. 1.
Figure 5:
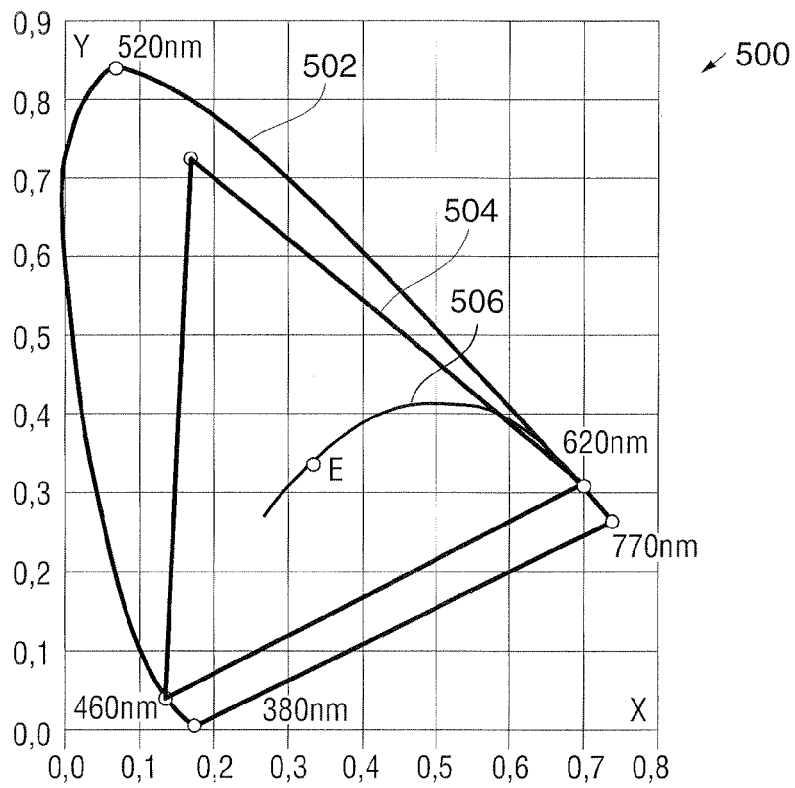
FIG. 5 is a plot showing the color coordinates in color space of the illumination device of FIG. 1.

Such a device, here using two green LEDs with a red and a blue LED, is capable of producing a high quality white light that cannot be obtained with a standard RGB device. FIG. 4 shows a plot 400 of typical spectral distributions that can be obtained with LEDs selected for a device such as described with respect to FIGS. 1-3. These LEDs can be selected based on factors such as wavelength and intensity. Using this distribution, along with two green LEDs, such a device can cover almost 85% of the visible color space 500, such as is shown in FIG. 5. The outer elliptical shape 502 represents all visible wavelengths, while the inner triangular shape 504 represents the colors that can be produced using a device such as described with respect to FIG. 1. The curved line 506 in the middle is referred to as a "white line," as the line represents all the combinations of the LEDs at all the various color temperatures that combine to produce white light. A good "sunlight" white can be obtained with a color temperature in a range around 2800-3500K. Table 1 shows the efficiencies and intensities for various color temperatures and currents.

TABLE 1

| Color Temperature K | Red mA | Green mA | Blue mA |
| --- | --- | --- | --- |
| 2800 | 100 | 61 | 13 |
| 3500 | 100 | 74 | 21 |
| 4000 | 100 | 82 | 26 |
| 5000 | 100 | 88 | 34 |
| 6500 | 100 | 96 | 36 |
| 7000 | 100 | 88 | 52 |

Such a device can allow similar currents to be applied to each of these state-of-the-art LED chips. The device also can operate at a relatively high power to produce high intensity light. The placement and use of the anode and cathode pads allow a user to easily apply and vary a desirable amount of current to each LED to obtain the desired illumination.

Figure 6:
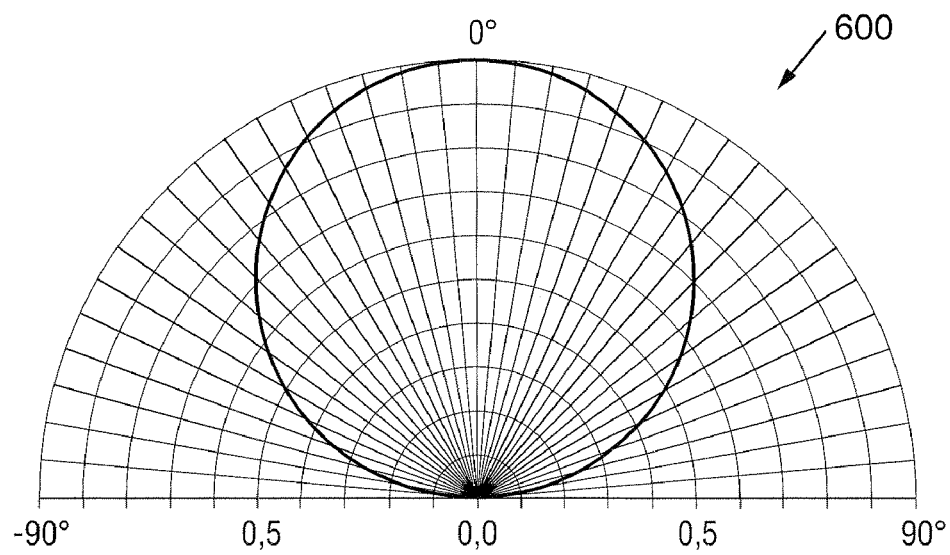
FIG. 6 is a plot showing a typical beam pattern for the device of FIG. 1.
Figure 7:
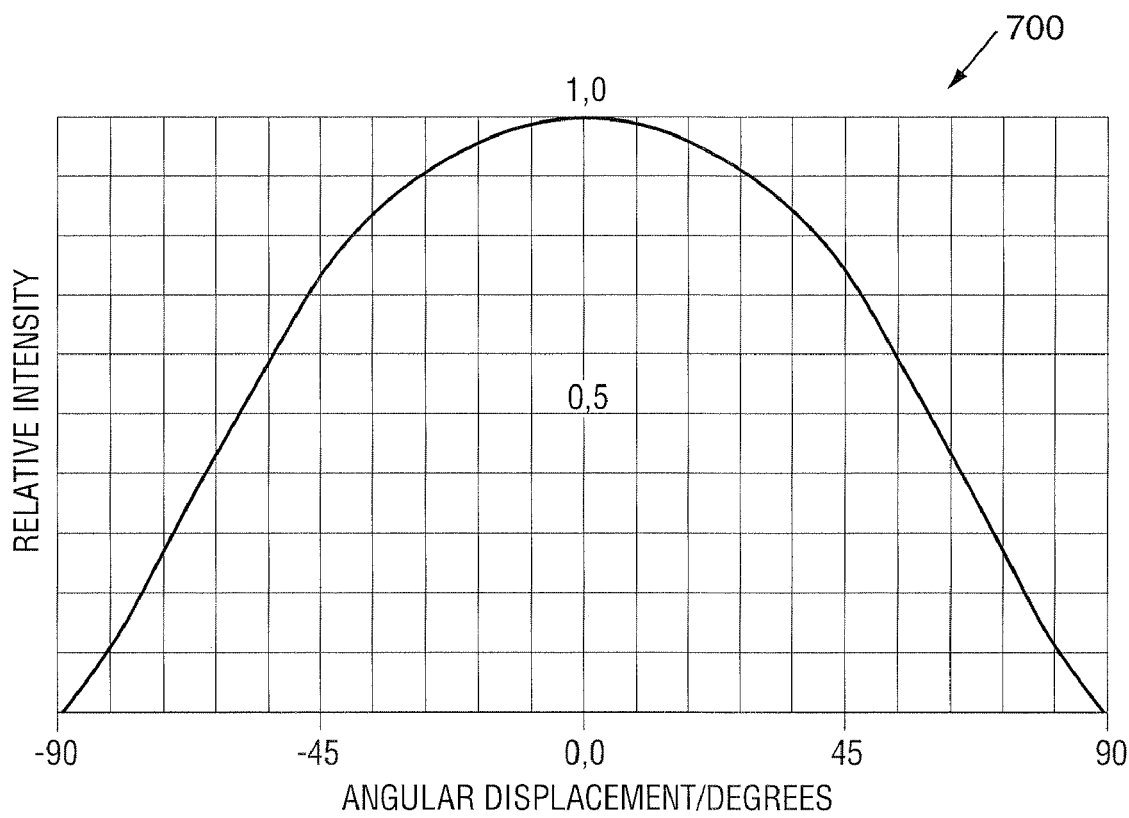
FIG. 7 is a plot showing the relative intensity by angular displacement of the device of FIG. 1.

Such a device also can tend to generate light in a fairly non-concentrated manner. A device in accordance with one embodiment is a Lambertian emitter with a 120° aperture. For instance, FIG. 6 shows a typical beam pattern 600 and FIG. 7 shows relative intensity 700 by angular displacement for a device such as is described with respect to FIG. 1. For various applications, such as projection, where it is desired to have a more focused beam of light produced, a number of optical elements can be used to adjust the output of the illumination device. Any of a number of optical elements known or used in the art can be positioned to collimate, focus, direct, filter, or otherwise modify the output of the device.

Figure 8:
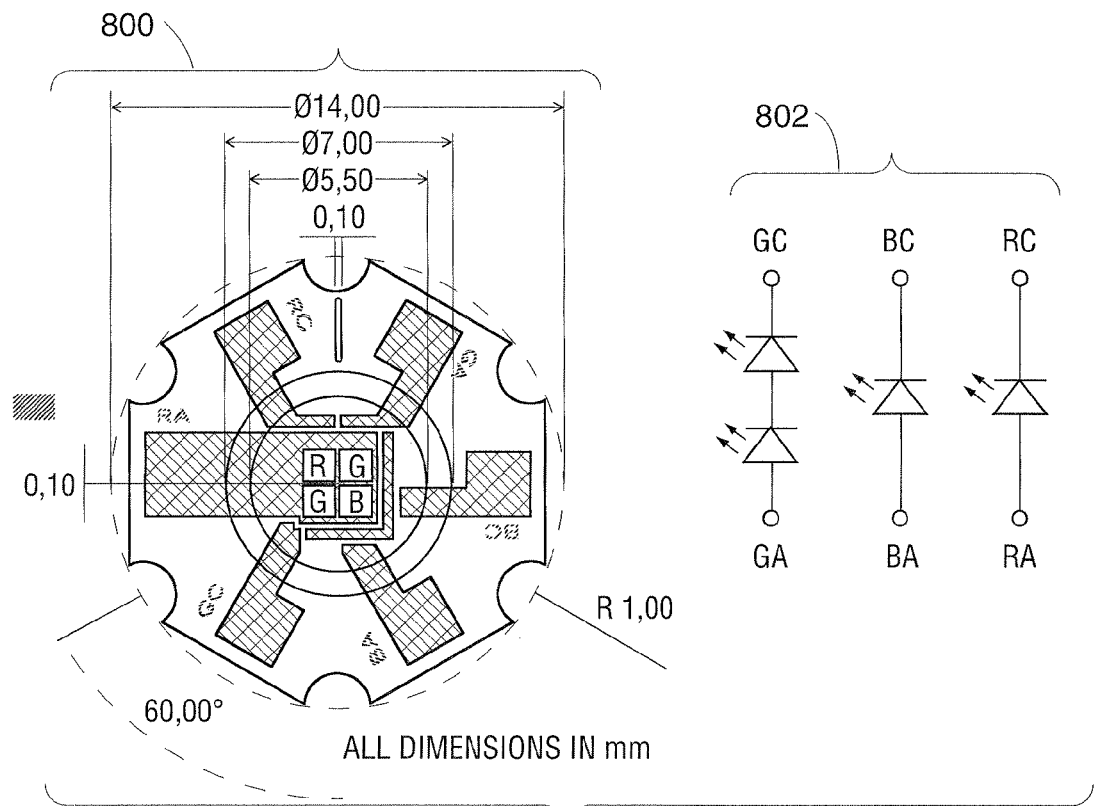
FIG. 8 is a top view and schematic diagram showing the LEDs of the device of FIG. 1.

FIG. 8 shows another top view 800 of the device of FIG. 1 with exemplary dimensions. FIG. 8 also shows a circuit diagram 802 for the LEDs showing that the green LEDs are connected in series.

Figure 9:
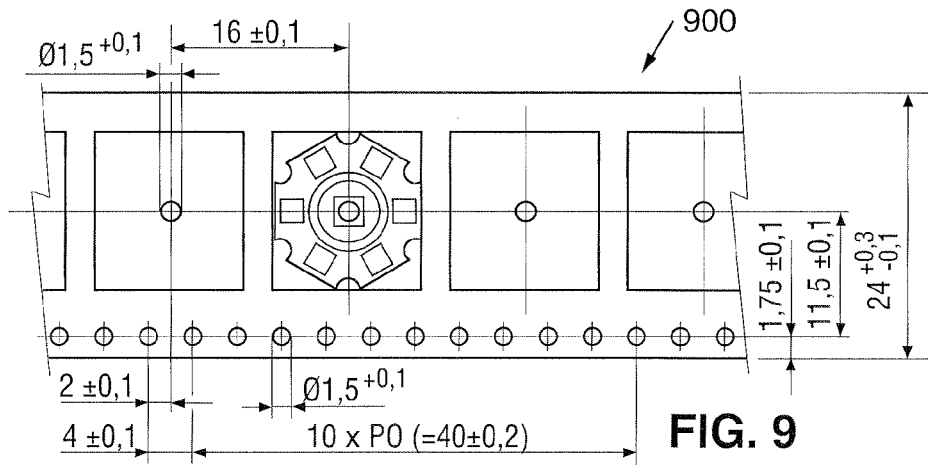
FIG. 9 is a top view of the device of FIG. 1 on blister tape packaging.
Figure 10:
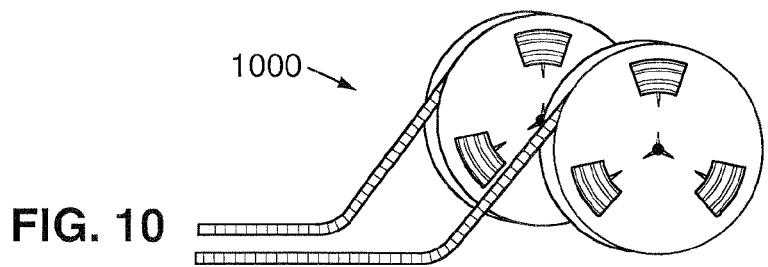
FIG. 10 is a perspective view of the blister tape of FIG. 9.

In order to easily store a number of these devices and deliver them to a customer, the devices can be attached to a blister pack or blister tape as known in the art. FIG. 9 shows the attachment 900 of such a device to a piece of blister tape. FIG. 10 shows the blister tape stored in rolls 1000 for easy storage and delivery. Electrical contacts on the backside of the device can allow for a variety of surface mounting techniques.

Figure 11:
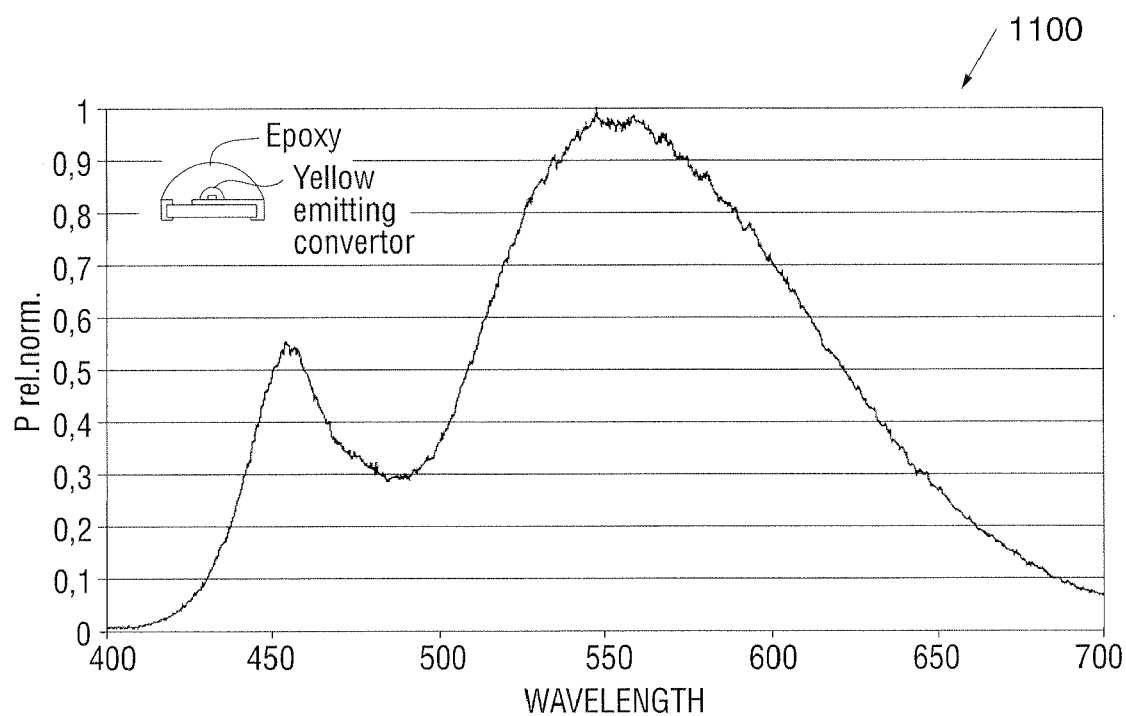
FIG. 11 is a plot showing the spectrum of a white light LED of the prior art.
Figure 12:
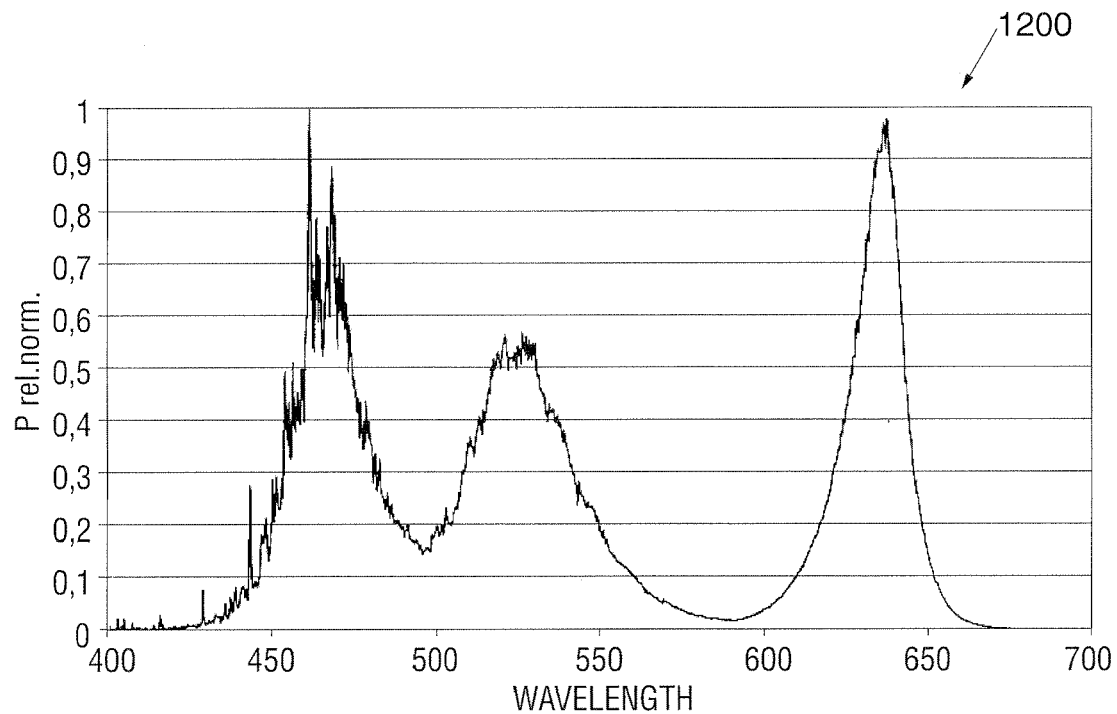
FIG. 12 is a plot showing the spectrum of the device of FIG. 1.

As discussed earlier, different systems have different strengths across the color spectrum. For example, a blue LED with a phosphor emitting yellow/green produces a spectrum 1100 such as is shown in FIG. 11. As can be seen, such a device produces strong yellow light and a medium amount of blue light, but does not produce much light in the red region of the spectrum. A device in accordance with one embodiment of the present invention can produce a spectrum such as is shown in FIG. 12, which produces similar intensity in the red, green, and blue regions of the spectrum. This provides for good color mixing, and the production of high quality white light.

Tables 2 and 3 present specifications that have been obtained for illumination devices in accordance with various embodiments.

TABLE 2

Technical Data
Optical and electrical characteristics
Ambient temperature = 25° C.

| Parameter | | Symbol | RED | GREEN | BLUE | Unit |
|---|---|---|---|---|---|---|
| Luminous flux** | @350 mA typ. | $\Phi_v$ | 16 | 26 | 2.7 | lm |
| Luminous flux*** | @350 mA typ. | $\Phi_v$ | 27 | 41 | 4 | lm |
| Dominant wavelength* | @350 mA | $\lambda_{dom}$ | (0) 620-630<br>(1) 620-630 | (0) 515-530<br>(1) 520-525<br>(2) 515-520<br>(3) 525-530 | (0) 455-465<br>(1) 460-465<br>(2) 455-460 | nm<br>nm<br>nm<br>nm |
| Spectral bandwidth | @350 mA typ. | $\Delta\lambda$ | 30 | 45 | 30 | nm |
| Forward voltage | @350 mA typ.<br>max. | $V_F$<br>$V_F$ | 2.5<br>3.0 | 7.0<br>8.0 | 3.6<br>4.0 | V<br>V |
| Optical efficiency** | @350 mA typ. | $\eta_{opt}$ | 18 | 11 | 2 | lm/W |
| Optical efficiency** | @50 mA typ. | $\eta_{opt}$ | 33 | 23 | 5 | lm/W |
| Optical efficiency*** | @350 mA typ. | $\eta_{opt}$ | 31 | 17 | 3 | lm/W |
| Viewing angle at 50% | typ. | $2\psi$ | 120 | 120 | 120 | degree |
| Radiating surface | typ. | $A_{rad}$ | 1.0 | 2 × 1.0 | 1.0 | mm² |
| Thermal resistance | | | | assembly: 10 | | K/W |

*binning: (0) = standard, (1) = main binning
Adequate heat sink is required. Derating must be observed to maintain junction temperature below maximum.
**Please note: These values are measured at realistic working conditions for thermal equilibrium with a small heat sink.
Attention: Some suppliers present only optimized laboratory conditions.
***Values for board-temperature of 25° C.

TABLE 3

Maximum Ratings @ 25° C.

| | | Symbol | Values | Unit |
|---|---|---|---|---|
| Operating temperature range | | $T_{op}$ | −40 to 100 | ° C. |
| Storage temperature | | $T_{st}$ | −40 to 100 | ° C. |
| Junction temperature | | $T_J$ | 120 | ° C. |
| Forward current per color | | $I_p$ | 350 | mA |
| Surge current per color | | $T_{op}$ | 700 | mA |
| Forward voltage | RED BLUE<br>GREEN | $V_R$<br>$V_R$ | 5<br>10 | V<br>V |
| Power consumption | RED<br>GREEN<br>BLUE | $P_{tot}$<br>$P_{tot}$<br>$P_{tot}$ | 1.05<br>3.2<br>1.8 | W<br>W<br>W |

It should be recognized that a number of variations of the above-identified embodiments will be obvious to one of ordinary skill in the art in view of the foregoing description. Accordingly, the invention is not to be limited by those specific embodiments and methods of the present invention shown and described herein. Rather, the scope of the invention is to be defined by the following claims and their equivalents.

What is claimed is:

1. A high intensity illumination device, comprising:
   a single red light emitting diode (LED);
   a single blue LED;
   one pair of green LEDs;
   a substrate supporting only the red, blue, and pair of green LEDs in a square array; and
   a circuit layout configured to receive a desired current level from an external source corresponding to each LED color and pass an appropriate current level to each one of the red, blue, and pair of green LEDs for generating light.

2. The illumination device as recited in claim 1, wherein spacing between the LEDs is on the order of 0.1 mm.

3. The illumination device as recited in claim 1, wherein the four LEDs are packed within an area less than 9 mm².

4. The illumination device as recited in claim 1, wherein said substrate has a hexagonal configuration.

5. The illumination device as recited in claim 1, wherein the illumination pattern created by the LEDs is Lambertian.

6. The illumination device as recited in claim 1, wherein said green LEDs are connected in series and said external source provides selectable drive currents to the red LED, the blue LED chip, and the series-connected LEDs.

7. The illumination device as recited in claim 1, wherein drive current level supplied by the external source to the individual LEDs is variable to produce a selected color output.

8. The illumination device as recited in claim 1, wherein said LEDs are sealed with an encapsulant.

9. An illumination device, comprising:
   a substrate;
   a circuit layout positioned on the substrate, the circuit layout including a plurality of anode and cathode pad pairs;
   a square array of four closely packed LEDs supported by the substrate and electrically connected to the circuit layout in order to allow activation through the application of current to an appropriate pair of the plurality of anode and cathode pads; and
   an encapsulant positioned over the square array of four LEDs to prevent external contact with the square array while out coupling light from the square array.

10. The illumination device as recited in claim 9, wherein the four LEDs are packed within an area less than 9 mm².

11. The illumination device as recited in claim 9, wherein spacing between the LEDs is on the order of 0.1 mm.

12. The illumination device as recited in claim 9, wherein said substrate has a hexagonal configuration.

13. The illumination device as recited in claim 9, wherein the illumination pattern created by the LEDs is Lambertian.

14. An illumination device, comprising:
a substrate;
a circuit layout positioned on the substrate, the circuit layout including a plurality of anode and cathode pad pairs;
a square array of four closely packed diodes supported by the substrate and electrically connected to the circuit layout via an associated pair of the plurality of anode and cathode pads, wherein at least three of the diodes are light emitting diodes; and
an encapsulant positioned over the square array of four diodes to prevent external contact with the square array while out coupling light from the square array.

15. The illumination device as recited in claim 14, wherein the four diodes are packed within an area less than 9 mm².

16. The illumination device as recited in claim 14, wherein spacing between the diodes is on the order of 0.1 mm.

17. The illumination device as recited in claim 14, wherein said substrate has a hexagonal configuration.

18. An illumination device comprising:
a substrate;
a set of four LEDs supported by the substrate and arranged in a two by two array in a manner such that the light emitted therefrom is mixed together, said LEDs including at least one red LED, one green LED and one blue LED; and
electrical contacts for individually supplying each of the red, green and blue LEDs with a selected current level, with the particular currents supplied to each LED being selected so that the mixed light corresponds to a particular color output.

19. The illumination device as recited in claim 18 wherein the fourth LED is a green LED.

20. The illumination device as recited in claim 18 wherein the currents supplied to the LEDs are selected so that the mixed light is white.

21. The illumination device as recited in claim 18, wherein spacing between the LEDs is on the order of 0.1 mm.

22. The illumination device as recited in claim 18, wherein the four LEDs are packed within an area less than 9 mm².

* * * * *